United States Patent
Shang et al.

(10) Patent No.: US 6,177,023 B1
(45) Date of Patent: Jan. 23, 2001

(54) METHOD AND APPARATUS FOR ELECTROSTATICALLY MAINTAINING SUBSTRATE FLATNESS

(75) Inventors: Quanyuan Shang, San Jose; Robert McCormick Robertson, Santa Clara; Kam S. Law, Union City; James T. Gardner, Fremont, all of CA (US)

(73) Assignee: Applied Komatsu Technology, Inc., Tokyo (JP)

( * ) Notice: Under 35 U.S.C. 154(b), the term of this patent shall be extended for 0 days.

(21) Appl. No.: 08/890,743

(22) Filed: Jul. 11, 1997

(51) Int. Cl.[7] .................. H02N 13/00; C23C 16/00
(52) U.S. Cl. .................. 216/67; 118/728; 361/234; 279/128
(58) Field of Search .................. 118/728, 723 E; 156/345; 204/298.15; 427/579, 569, 574; 216/67; 279/128; 361/234

(56) References Cited

U.S. PATENT DOCUMENTS

| | | | |
|---|---|---|---|
| 4,184,188 | | 1/1980 | Briglia .................. 361/234 |
| 4,298,443 | * | 11/1981 | Maydan .................. 204/192 |
| 4,384,918 | | 5/1983 | Abe .................. 156/643 |
| 4,431,473 | | 2/1984 | Okano et al. .................. 156/345 |
| 4,931,135 | | 6/1990 | Horinchi et al. .................. 156/643 |
| 5,092,729 | | 3/1992 | Yamazaki et al. .................. 414/225 |
| 5,179,498 | | 1/1993 | Hongoh et al. .................. 361/234 |
| 5,304,249 | * | 4/1994 | Chosa .................. 118/728 |
| 5,310,453 | | 5/1994 | Fukasawa et al. .................. 156/643 |
| 5,458,687 | * | 10/1995 | Shichida et al. .................. 118/724 |
| 5,547,539 | * | 8/1996 | Arasawa et al. .................. 216/67 |
| 5,790,365 | * | 8/1998 | Shel .................. 361/234 |
| 5,897,711 | * | 4/1999 | Denison .................. 427/579 |
| 5,900,062 | * | 5/1999 | Loewenhardt .................. 118/723 R |
| 5,904,779 | * | 5/1999 | Dhindsa .................. 118/723 E |
| 5,906,684 | * | 5/1999 | Tamura et al. .................. 118/728 |
| 5,910,338 | * | 6/1999 | Donde .................. 427/290 |
| 6,001,432 | * | 12/1999 | Yamazaki et al. .................. 427/577 |

FOREIGN PATENT DOCUMENTS

| | | | |
|---|---|---|---|
| 6112303 | * | 4/1994 | (JP) .................. H01L/21/68 |
| 6244147 | | 9/1994 | (JP) . |

* cited by examiner

Primary Examiner—Randy Gulakowski
Assistant Examiner—Shamim Ahmed
(74) Attorney, Agent, or Firm—Bozicevic, Field & Francis, LLP

(57) ABSTRACT

An apparatus and method for holding a substrate on a support layer in a processing chamber. The method includes the steps of positioning the substrate a predetermined distance from the support layer, introducing a plasma in the processing chamber, lowering the substrate to a point where the substrate engages the support layer, and maintaining the plasma for a predetermined time. The apparatus is directed to a susceptor system for a processing chamber in which a substrate is electrostatically held essentially flat. The apparatus includes a substrate support and a support layer composed of a dielectric material disposed on the substrate support. At least one lift pin is used for supporting the substrate relative to the support layer. Means are provided for moving each lift pin relative to the support layer. Means are also provided for producing a plasma within the processing chamber.

16 Claims, 4 Drawing Sheets

METHOD AND APPARATUS FOR ELECTROSTATICALLY MAINTAINING SUBSTRATE FLATNESS

FIELD OF THE INVENTION

The present invention relates generally to a substrate support for maintaining an essentially flat substrate, and more particularly to a hot substrate support that electrostatically maintains the flatness of a substrate.

BACKGROUND OF THE INVENTION

A susceptor is a mechanical part that functions as a ground electrode and holds a substrate in a processing chamber during fabrication, such as plasma-enhanced chemical vapor deposition (PECVD). The susceptor includes a substrate support plate mounted on a stem, along with a lift assembly for raising and lowering the substrate within the processing chamber. The substrate is held essentially flat to facilitate the deposition process.

The extent to which the substrate is held flat generally leads to more uniform structural parameters across the substrate surface. For example, it is easier to grow a film of uniform thickness on a flat substrate than on one that may have a degree of curvature due to, for example, thermal stress. Thus, if uniform structural parameters are required by the process, the substrate must be held essentially flat.

In the absence of mechanisms which physically hold the substrate flat, substrates tend to become slightly curved during processing for a number of reasons. For example, a nonuniform temperature across the substrate tends to induce a curvature due to different amounts of thermal expansion at different areas within the substrate. In a large substrate, for example 550×650 square millimeters ($mm^2$), a significant difference in thermal expansion may occur because the substrate heater may not be able to provide a uniform temperature across the large dimensions of the substrate. Further, the perimeter of the substrate has more surface area than the central areas and thus radiates heat faster than the central areas, again leading to temperature nonuniformity, thermal stress and consequent curvature. In smaller substrates, for example, substrates around 360×450 $mm^2$, the problem is less pronounced but nevertheless evident.

All of the above difficulties become worse as the processing temperature rises. At a typical processing temperature of 320 degrees Celsius (° C.), which is common for a glass substrate, the glass substrate will lose its flatness due to the kinds of thermal stress mentioned above.

It is thus important to hold substrates essentially flat to prevent such curvature. Previous methods and apparatuses for holding substrates flat employ a frame which physically contacts the substrate around the substrate's perimeter and holds the substrate against the substrate support by the support's weight. Several difficulties have been noticed with such systems.

First, the substrate area covered by the frame is sacrificed. Thus, there is less surface area of the substrate which may be used for devices or deposition. If the entirety of the perimeter of the substrate is under the frame, substantial loss of surface area may result.

Second, the thickness of the deposited materials is not constant near the frame. This is primarily a geometric effect and occurs because of the thickness of the frame. In regions near the center of the substrate, impinging deposition gas molecules or atoms strike the surface of the substrate over a solid angle of $2\pi$ steradians corresponding to a hemisphere. Near the perimeter of the substrate, the frame partially blocks gas molecules over a significant fraction of the $2\pi$ angle. Near a corner of the frame, blockage is even worse. Thus, it is expected that less gas molecules strike the substrate near the substrate's perimeter. As a result, the thickness of deposition is usually not uniform near the perimeter of the substrate.

Third, deposited material may seep under the frame. Such material cannot be used in films because its thickness is uncontrollable. This problem arises because the frame typically does not contact the substrate in an abrupt manner. In other words, the effective deposition "shadow" of the frame (the point at which edge of the frame starts to inhibit deposition) is not at the same point where the frame physically touches the substrate. One reason for this is that the frame may not be completely parallel to the substrate when intimate contact is made. As a result, some deposition may occur on the substrate under the frame. Of course, the amount of such deposition is less than on the unframed central region of the substrate. This deposition may be problematic in the sense that it is uncontrollable.

Fourth, a physical frame for holding the substrate flat constitutes a large structure to be placed in a processing chamber. As such, it is a potential source for contaminant particles in the chamber which may degrade the quality of the deposited film. This may be particularly true as the contact between the frame and the substrate often causes particle release due to friction. Such particles can also adversely affect the quality of the chamber vacuum.

Fifth, a physical frame affects the reliability of transfer when a substrate is processed in one chamber and then moved to another for further processing. In particular, as a substrate is transferred from one chamber to another, a new frame is usually used. Each frame must be aligned in each processing chamber to the same position to avoid a loss of substrate processing area due to misalignment. When misalignment occurs, some of the substrate processing area used in one chamber is shadowed by the frame in the next chamber. Further, some of the substrate previously shadowed by a frame in the one chamber is not covered in the next chamber. In both cases, these areas must be sacrificed as not having been fully processed. To combat this problem, complicated realignment mechanisms must be used to ensure the same area is covered by each frame. Such mechanisms again lead to more particle-releasing surface area in the chamber and ensuing particle contamination and breakdown. Such mechanisms are also expensive and complex, increasing markedly the manufacturing cost of the processing chamber.

The inventors have discovered a need to provide a method and apparatus for keeping substrates essentially flat to increase the usable substrate area and to enhance film uniformity across this area, particularly near the edges of the substrate. The method and apparatus should not require complex mechanisms, and should not lead to contamination of the processing chamber. The present invention fulfills these needs.

SUMMARY

In one embodiment, the invention is directed to a method for holding a substrate on a support layer in a processing chamber. The method includes steps of locating the substrate a predetermined distance from the support layer, starting a plasma in the processing chamber, lowering the substrate to a point where the substrate engages the support layer, and maintaining the plasma for a predetermined time.

Implementations of the invention may include one or more of the following. The method may further comprise steps of stopping the plasma and depositing a film on the substrate. The plasma may constitute a gas that is inert to the substrate, for example one selected from the group consisting of nitrogen, hydrogen, argon, helium, krypton, xenon, neon, radon, mixtures thereof, or other similar gases, molecular or otherwise that can form a plasma. The pressure of the gas may be in a range of from about 200 mTorr to about 1 Torr. The power of the plasma may be in a range of from about 100 watts to about 1000 watts. The power density of the plasma may be in a range of from about 0.02 watts per square centimeter of substrate area to about 0.5 watts per square centimeter of substrate area, or about 0.4 watts per cubic centimeter of chamber volume to about 4 watts per cubic centimeter of chamber volume. The substrate may be made of glass. The support layer preferably is a dielectric material, such as anodized aluminum or alumina ($Al_2O_3$). The method may further comprise the step of depositing a coating on top of the support layer. The preferred coating may be selected from the group consisting of silicon nitrides, silicon oxides, silicon carbides and mixtures thereof.

In another embodiment, the invention is directed to a susceptor system for a processing chamber in which a substrate is electrostatically held essentially flat. The system includes a substrate support and a support layer composed of a dielectric material disposed on the substrate support. At least one lift pin is used for supporting the substrate relative to the support layer. Means are provided for moving each lift pin relative to the support layer. Means are also provided for by igniting a plasma within the processing chamber. A gas supply supplies a gas to the interior of the processing chamber.

In another embodiment, the invention is directed to a method for processing a substrate in a processing chamber. The method includes steps of locating the substrate a predetermined distance from a support layer, starting a plasma in the processing chamber, lowering the substrate to a point where the substrate engages the support layer, maintaining the plasma for a predetermined time, and depositing or growing a thin film on the substrate.

Among the advantages of the invention are the following. A method and apparatus are provided for maintaining a substrate in an essentially flat position. An increase in usable substrate area is achieved, and film uniformity grown thereon is enhanced. The method and apparatus do not require complicated frame mechanisms, and thus have the advantage of not locating potentially contaminant-producing structures into the processing chamber. The method and apparatus may be used in processing substrates in semiconductor processing chambers.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

The present invention is directed to a method and apparatus for maintaining a substrate essentially flat. In the implementation described below, the invention is described with respect to a CVD chamber. However, the invention is also applicable to other sorts of processing chambers. For example, the invention may be used in chambers which carry out the following fabrication processes: CVD, PECVD, etching processes, physical vapor deposition (PVD), and rapid thermal processes such as rapid thermal annealing (RTA). Certain of the details described are specific to this implementation and may be changed as required by the processing conditions and parameters.

The present invention may be used in a model AKT-3500 PECVD System, manufactured by Applied Komatsu Technology of Santa Clara, Calif. The AKT-3500 PECVD is designed for use in the production of substrates for large liquid crystal flat panel displays. It is a modular system with multiple process chambers which can be used for depositing amorphous silicon, silicon nitrides, silicon oxides, and oxynitride films. More details regarding the system may be found in U.S. patent application Ser. No. 08/707,491, entitled "A Deposition Chamber Cleaning Technique Using a High Power Remote Excitation Source", filed Sep. 16, 1996, assigned to the assignee of the present invention and incorporated herein by reference. The present invention, however, may be used with any commercially-available deposition system.

PECVD or CVD are processes used to deposit a thin film layer onto a substrate. We intend the term "substrate" to broadly cover any object that is being processed in a process chamber. The term "substrate" includes, for example, flat panel displays, and glass or ceramic plates or disks. The present invention is particularly applicable to large substrates such as glass plates having areas of 360×450 $mm^2$, 550×650 $mm^2$, and larger. The remainder of this detailed description describes an embodiment in which a glass substrate is used. However as noted above, other substrates may also be used.

In general, the substrate is supported in a vacuum deposition process chamber and is heated to several hundred ° C. Deposition gases are injected into the chamber, and a chemical reaction occurs to deposit a thin film layer onto the substrate. The thin film deposited layer may be a dielectric layer (such as silicon nitride or silicon oxide), a semiconductor layer (such as amorphous silicon), or a metal layer (such as tungsten). The deposition process may be PECVD or thermally-enhanced chemical vapor deposition. In the chamber shown in FIG. 1, a plasma is used. Thus, appropriate plasma ignition means, such as the radio frequency (RF) voltage described below, are generally required.

Figure 1:
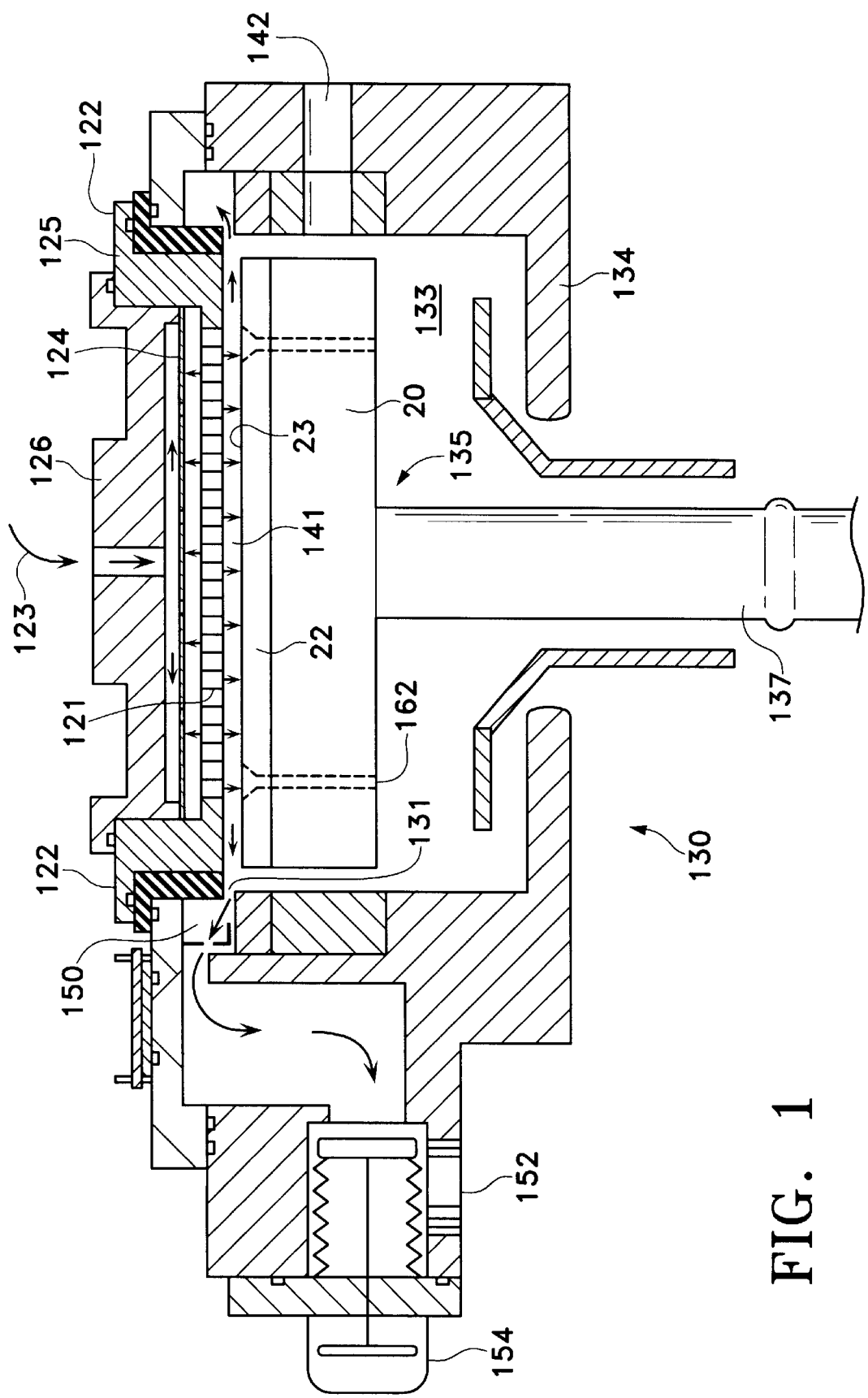
FIG. 1 is a cross-sectional view of a CVD processing chamber.

As shown in FIG. 1, a CVD apparatus 130 includes a susceptor 135 having a substrate support plate 20 mounted on a stem 137. Support plate 20 may be fabricated, for example, of high purity unanodized cast aluminum or of aluminum alloys. Susceptor 135 is shown centered within a vacuum deposition process chamber 133. A support layer 22 is located on a plate surface 176 of support plate 20 to support a substrate such as a glass panel (shown in FIG. 4) in a substrate processing or reaction region 141. As discussed in more detail below, and in accordance with the present invention, support layer 22 constitutes a dielectric material. A lift mechanism (not shown) is provided to raise and lower the susceptor 135. Commands to the lift mechanism are provided by a controller in known fashion. Substrates are transferred into and out of chamber 133 through an opening 142 in a sidewall 134 of the chamber 133 by a robot blade (not shown).

The deposition process gases (indicated by arrow 123) flow into chamber 133 through an inlet manifold 126. The gases then flow through a perforated blocker plate 124 and holes 121 in a process gas distribution faceplate 122 (indicated by small arrows in the substrate processing region 141 of FIG. 1). Support layer 22 of support plate 20 is parallel and spaced-closely to faceplate 122. An RF power supply 172 (shown in FIG. 4) may be used to apply electrical power between gas distribution faceplate 122 and susceptor 135 so as to excite the process gas mixture to form a plasma. The constituents of the plasma react to deposit a desired film on the surface of the substrate on support plate 20.

The deposition process gases may be exhausted from the chamber through a slot-shaped orifice 131 surrounding the reaction region 141 into an exhaust plenum 150. From exhaust plenum 150, the gases flow by a vacuum shut-off valve 152 and into an exhaust outlet 154 which connects to an external vacuum pump (not shown).

Figure 2:
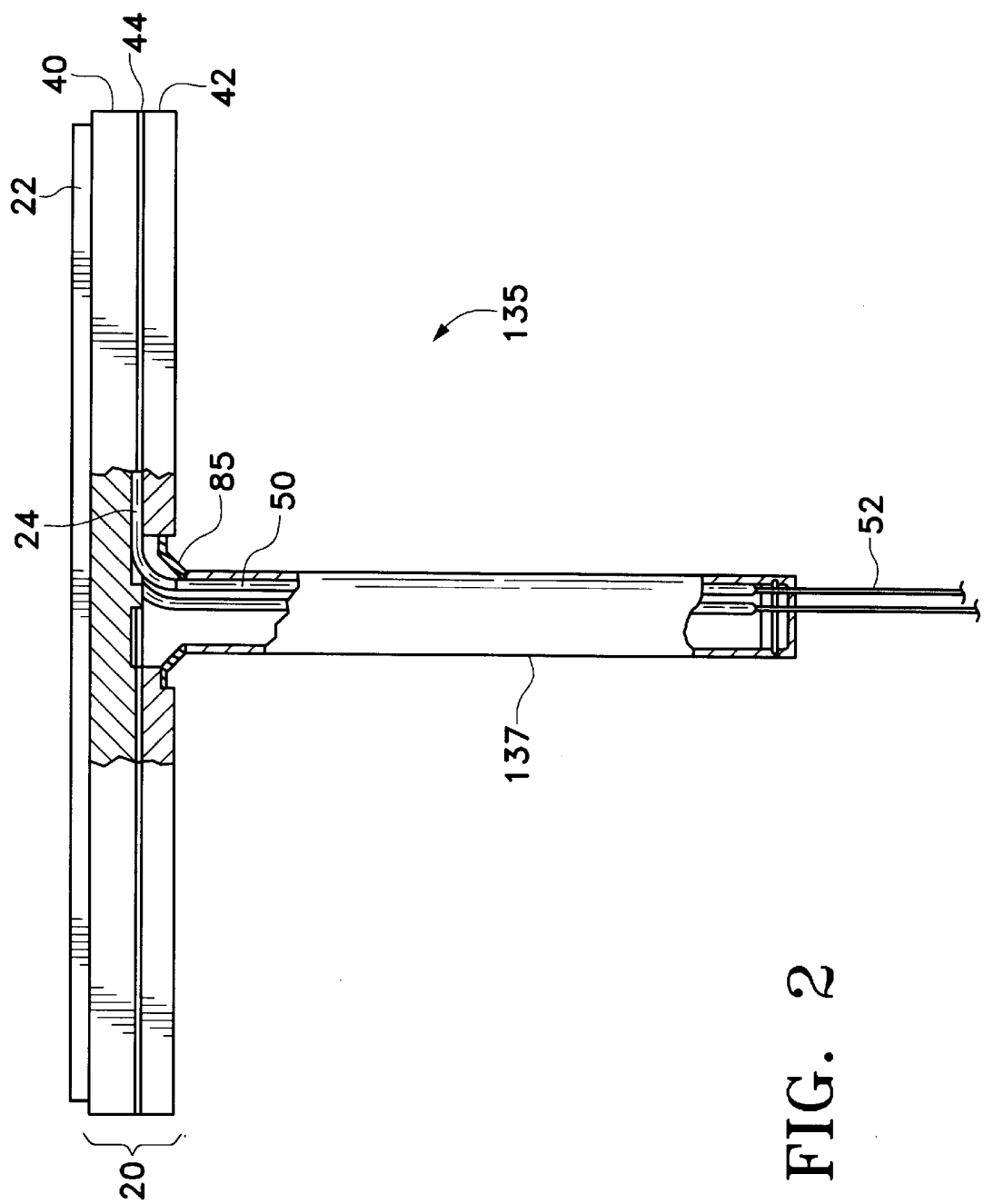
FIG. 2 shows the electrical connections to a heating element used in the CVD processing chamber of FIG. 1.

Referring to FIG. 2, support plate 20, as noted, is attached to stem 137 of susceptor 135. Support plate 20 may include a top plate 40, a base plate 42, and a braised region 44 therebetween. Disposed in support plate 20 between top plate 40 and base plate 42 are heaters 24 and 26. In the illustrated embodiment, one or more heating element tubes 50 (only one is visible in FIG. 2) are disposed within the hollow core of stem 137. Each tube includes a conductive lead wire 52 for attachment to an end of a filament of a heating element. Tubes 50 are terminated at the end of stem 137, and lead wires 52 are connected to a heater controller which powers the heating elements and monitors the temperature of support plate 20. The heaters may be located about 0.25 in. beneath the uppermost surface of support layer 22 on support plate 20. In this embodiment, one heater is run at approximately 0.66 in. from the outer edge of the plate, while another is run at approximately 7.75 in. from the outer edge. This configuration provides for uniform heating of a substrate 165 placed on support plate 20.

Stem 137 includes a hollow core and is configured to mate with base plate 42 of support plate 20. A vacuum tight joint 85 is made such that the inside of the hollow core is at ambient (atmospheric) pressure.

Figure 3:
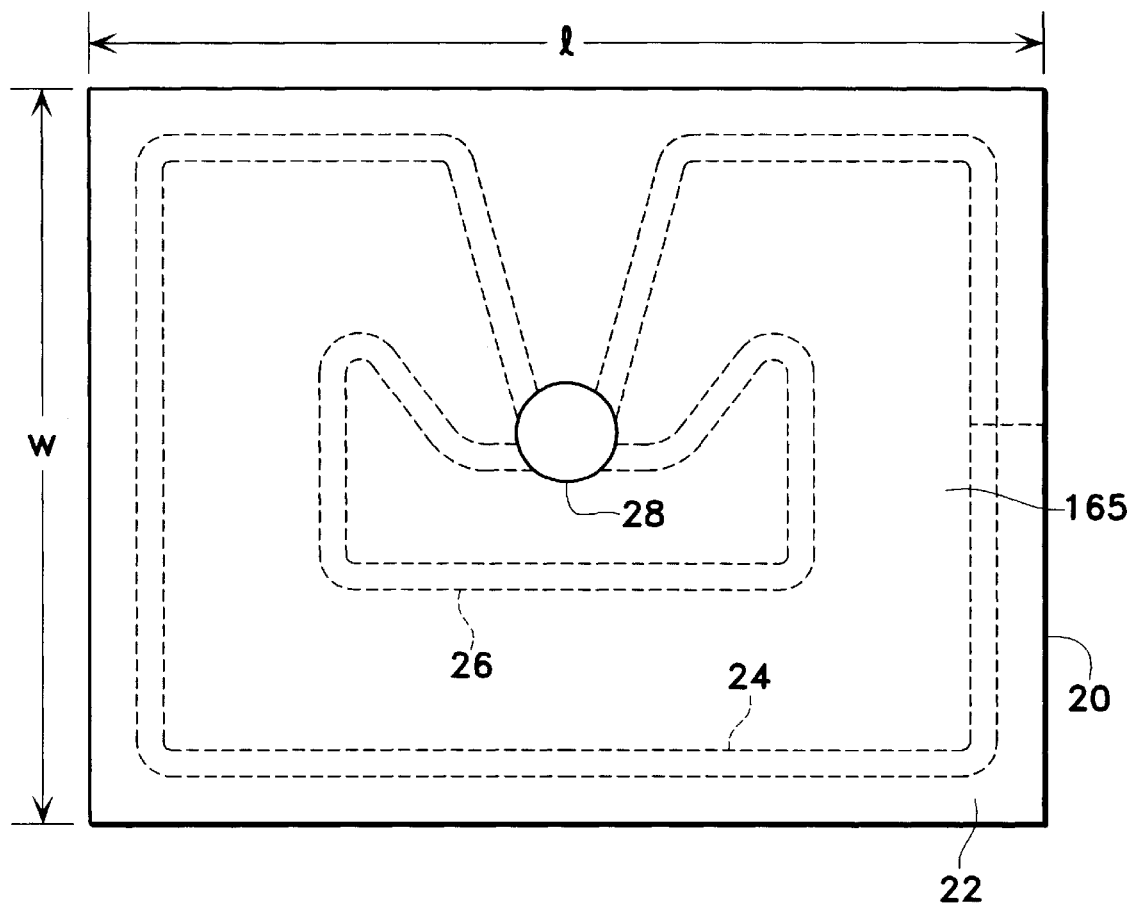
FIG. 3 is a top view of a substrate support plate used in the CVD processing chamber of FIG. 1.

FIG. 3 shows a top view of substrate support plate 20. As noted, support plate 20 includes a support layer 22 for supporting a substrate 165 (shown in phantom) in the vacuum deposition process chamber. Heaters 24 and 26 (both shown in phantom) are disposed beneath support layer 22 on support plate 20. Support plate 20 is rectangular in shape, and has a width "w" of about 26.26 inches and a length "l" of about 32.26 inches.

Figure 4:
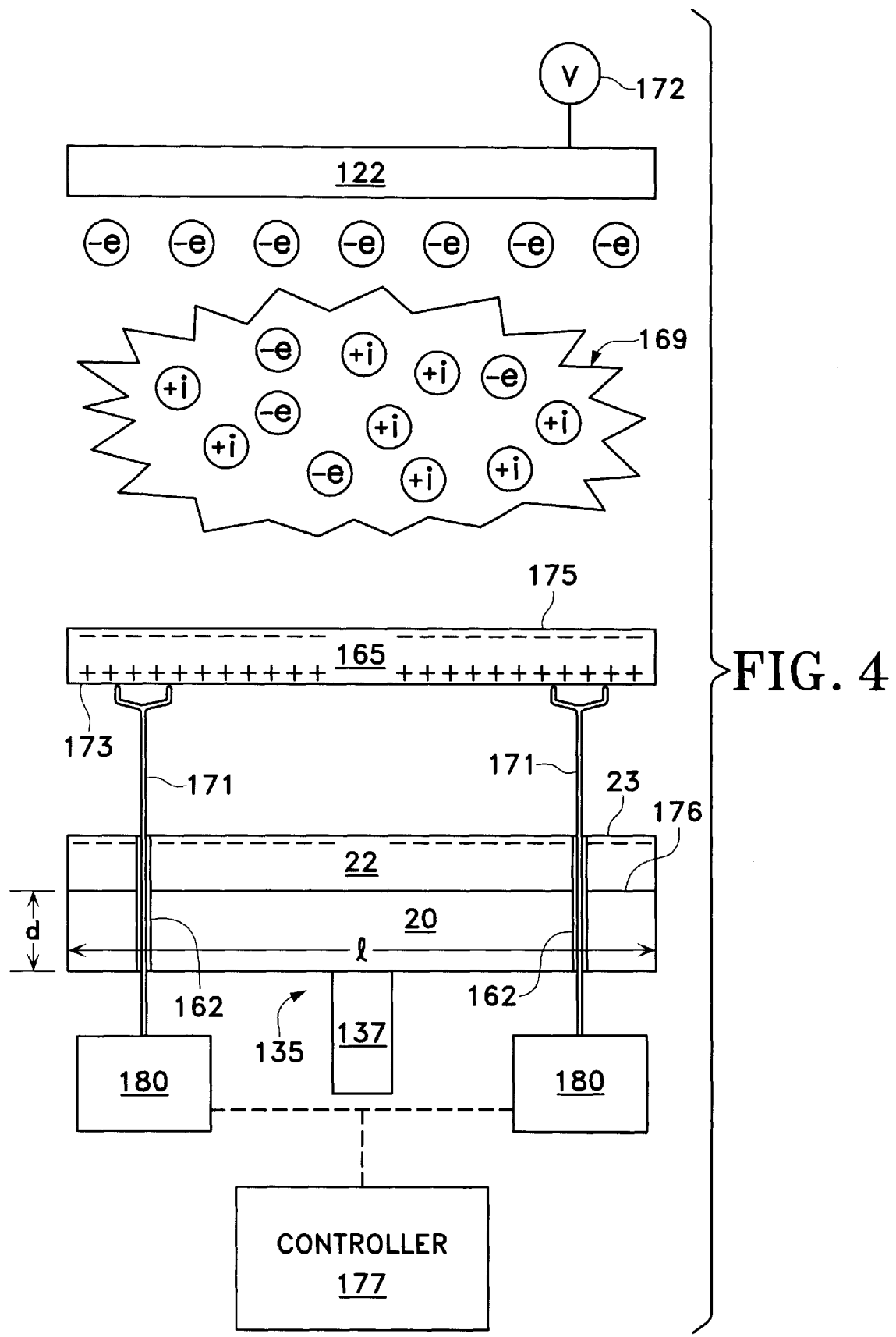
FIG. 4 is a cross-sectional view of a processing chamber used according to the present invention showing details of the substrate support and the plasma used in the CVD processing chamber of FIG. 1.

FIG. 4 shows the depth "d" and length of support plate 20. A typical depth of support plate 20 may be about one inch. This allows for the processing of a glass substrate for flat panel displays of up to about 1 square meter (m²). The size of support plate 20 is scalable to accommodate either larger or smaller substrates.

Support layer 22 is disposed on top of support plate 20. Support layer 22 may be a separate plate placed in intimate contact with a surface 176 of support plate 20 or a thick layer of a material coated on surface 176 of support plate 20. The material constituting support layer 22 is anodized or otherwise treated so that support layer 22 has the properties of a dielectric. For example, anodized aluminum or alumina ($Al_2O_3$) may be used. In this way, any charge induced on a surface 23 of support layer 22 is stationary.

A coating (not shown) may be deposited on surface 23 of support layer 22 to enhance the dielectric properties of support layer 22. In other words, if support layer 22 by itself is not a superior dielectric, the coating may improve its dielectric properties. Such coatings may constitute dielectrics, and may be, for example, silicon nitrides ($Si_xN_y$), silicon oxides ($Si_wO_z$), silicon carbides ($Si_rC_s$) or other such dielectrics. One type of SiN deposition is described in U.S. Pat. No. 5,399,387, assigned to the assignee of the present invention and incorporated herein by reference. This coating enhances the effect of the invention but is not inherently required for its practice.

As mentioned above, a robot blade facilitates the transfer of substrates into and out of chamber 133 through an opening 142 in sidewall 134 of chamber 133. Once the robot blade moves substrate 165 into position, lift pins 171 move upwards to support substrate 165 prior to lowering into a processing position. In particular, lift pins 171 move through lift pin holes 162 to contact and support substrate 165. Lift pins 171 may move through lift pin holes 162 by the action of a lift means 180 such as known translation mechanisms or linear feedthroughs.

After substrate 165 has been contacted and supported by lift pins 171, the robot blade is withdrawn and substrate 165 may be lowered into position for processing. In the method of the invention, substrate 165 is not lowered into intimate contact with support layer 22 (or a coating) until after a plasma 169 is ignited in the chamber.

In particular, lift pins 171 retract and lower substrate 165 until a bottom surface 173 of substrate 165 is at a predetermined separation distance, in a range of about 20 to 50 mils above surface 23 of support layer 22. This position is termed here an "intermediate height". Lift pins 171 may be attached to a moving means which is remotely and/or computer-controlled by a controller 177. At this point, a plate-charge inducing plasma 169 is started or ignited in chamber 133. The separation distance is chosen to be wide enough for this plasma to enter the volume between substrate 165 and support layer 22. If the distance is too small, no plasma will enter this volume and no charge effects will occur. If the distance is too large, the plasma may become unstable near the edges of substrate 165.

Plate-charge inducing plasma 169 is formed from a gas that is relatively inert to the substrate, such as nitrogen ($N_2$), hydrogen ($H_2$), argon (Ar), helium (He), krypton (Kr), xenon (Xe), radon (Rn), or mixtures thereof. Other gases with similar plasma properties may also be used. A requirement of the gas used is that it not itself deposit on substrate 165. The power of plasma 169 may be relatively low, such as in a range of about 100 watts to 1000 watts for a chamber having a volume of 250 cubic centimeters and a substrate processing area of 550×650 mm²; the power would scale up or down for chambers of larger or smaller volumes, or larger or smaller substrate processing areas, respectively. For example, as the power scales with the size of substrate 165, a usable range of power densities may be 0.02 watts per square centimeter to 0.5 watts per square centimeter of substrate area. As the power also scales with the volume of chamber 133, a usable range of power densities may be 0.4 watts per cubic centimeter to 4 watts per cubic centimeter of chamber volume.

The pressure of plate-charge inducing plasma 169 may be between about 200 milliTorr (mTorr) and 3 Torr. Generally lower pressures are preferred because they allow a larger bias to be induced between substrate 165 and support layer 22 (in a manner to be explained below). This bias refers to the amount of charge induced on the bottom surface 173 of substrate 165 and the amount of charged induced on support layer 22. These charges are responsible for an electric field having features and advantages discussed below.

After plasma 169 is ignited, substrate 165 is lowered onto support layer 22, to a "processing height", by retracting lift pins 171. The rate at which the substrate is dropped may be on the order of an inch every few seconds, such as one inch every three seconds. After placement of substrate 165 on support layer 22, plasma 169 is maintained for a predetermined time which may be measured in seconds. For example, ten seconds has been found to be appropriate for a large glass substrate. However, it should be noted that there is a wide range of variation in the length of this time period. Longer or shorter time periods may also be used depending on the substrate material, the plasma power, the support layer material, the coating material, and the type of gas used in the plasma.

After engaging substrate 165 on support layer 22 and maintaining plasma 169 for several seconds, substrate 165 is held in an essentially flat manner against support layer 22 and is highly resistant to curvature.

One reason why substrate 165 is held to support layer 22 is believed to be because of electrostatic attraction. In particular, it is noted that plate-charge inducing plasma 169 is composed of electrons (denoted in FIG. 4 as "−e") and positive ions (denoted in FIG. 4 as "+i"). The voltage applied via voltage source 172 to ignite plasma 169 is an RF voltage which alternates between a positive value and a negative value. The potential of susceptor 135 is held to ground. When the applied voltage is positive, electrons are attracted to faceplate 122. When the applied voltage is negative, positive ions are attracted to faceplate 122. As even the smallest positive ion is about 2000 times more massive than an electron, the electrons move much faster due to lower inertia. When the electrons are attracted to the faceplate 122, a net positive charge is left in plasma 169 because most of the remaining species within plasma 169 are positive ions. Even when electrons are repelled by a negative voltage swing of source 172, they are not believed to be repelled so far as to render the net charge of plasma 169 neutral. This is indicated in FIG. 4 by the placement of several electrons adjacent faceplate 122. The net positive charge of plasma 169 (indicated in FIG. 4 by a preponderance of positive ions in plasma 169) then induces a negative charge on a top surface 175 of substrate 165 (indicated by a series of negative signs near surface 175). By conservation of charge, this induced negative charge in turn induces a positive charge on bottom surface 173 of substrate 165 (indicated by a series of positive signs on surface 173). This positive charge then induces a negative charge on top surface 23 of support layer 22 (indicated by a series of negative signs on surface 23).

Another factor enhances the induced negative charge on top surface 23. Because surface 23 is not completely electrically screened from plasma 169 (such partial screening occurring because of the placement of substrate 165), the net positive charge of plasma 169 also tends to induce a negative charge on surface 23 of support layer 22. Thus, an electrostatic attraction is formed between surface 23 of support layer 22 and bottom surface 173 of substrate 165.

To summarize, bottom surface 173 of substrate 165 is left with an induced positive charge, and top surface 23 of support layer 22 is left with an induced negative charge. By Coulomb electrostatic attraction, substrate 165 is held substantially flat against support layer 22.

Following several seconds of plasma 169, plasma 169 may be stopped or extinguished and further processing of substrate 165 may begin. Further processing may also begin without stopping plasma 169. In this method, the inert gas or gases forming plasma 169 are simply replaced by appropriate process gases while source 172 continually causes the gases to enter the plasma state.

Further processing may include film deposition. Such processing may involve reinstatement of a different plasma for use in deposition or other processes, and this plasma may be of an inert gas or otherwise.

Once further processing is completed, substrate 165 is removed from support layer 22. This may be accomplished by using lift pins 171 to force the substrate off of support layer 22. Another way to remove substrate 165 from support layer 22 is described in U.S. Pat. No. 5,380,566, issued Jan. 10, 1995, assigned to the assignee of the present invention and incorporated herein by reference.

In summary, a substrate support including an electrostatic substrate attachment feature has been disclosed. This feature allows a substrate to be held essentially flat against a support layer without loss of usable substrate area.

A number of embodiments of the present invention have been described. Nevertheless, it will be understood that various modifications may be made without departing from the spirit and scope of the invention.

What is claimed is:

1. A method of holding a substrate on a support layer in a processing chamber, comprising the steps of:
   positioning a substrate a predetermined distance from the support layer;
   introducing a gas into the chamber wherein the gas is inert relative to the substrate;
   igniting the gas under conditions so as to form a plasma in the chamber, thereby creating a positive charge on a surface of the substrate facing the support layer and a negative charge on a surface of the support layer facing the substrate;
   maintaining the positive and negative charges over a period of time thereby holding the substrate in a desired position relative to the support.

2. The method of claim 1, further comprising:
   depositing a coating on the surface of the support layer facing the substrate layer.

3. The method of claim 2, wherein the coating is composed of a material selected from the group consisting of silicon nitrides, silicon oxides, silicon carbides and combinations thereof.

4. The method of claim 2, further comprising:
   subjecting a surface of the substrate facing away from the support layer to further processing.

5. The method of claim 4, wherein the further processing forms a layer on the substrate surface.

6. The method of claim 5, wherein the further processing is selected from the group consisting of chemical vapor deposition and physical vapor deposition.

7. The method of claim 1, wherein the inert gas is selected from the group consisting of nitrogen, hydrogen, argon, helium, or mixtures thereof.

8. The method of claim 1, wherein the conditions comprise a pressure of the gas is in a range of from about 200 mTorr to about 1 Torr.

9. The method of claim 1, wherein the conditions comprise applying power in range from about 10 watts to about 1000 watts.

10. The method of claim 1, wherein the conditions comprise maintaining a power density in a range from about 0.02 watts per square centimeter of substrate area to about 0.5 watts per square centimeter of substrate area.

11. The method of claim 1, wherein the conditions comprise maintaining a power density in a range from about 0.4 watts per cubic centimeter of chamber volume to about 4 watts per cubic centimeter of chamber volume.

12. The method of claim 1, wherein the substrate is comprised of glass.

13. The method of claim 1, wherein the substrate is comprised of ceramic.

14. The method of claim 1, wherein the support layer is comprised of a dielectric material.

15. The method of claim 14, wherein the dielectric material is comprised of anodized aluminum.

16. The method of claim 14, wherein the dielectric material is comprised of alumina ($Al_2O_3$).

* * * * *